(12) United States Patent
Pinarbasi et al.

(10) Patent No.: US 10,211,395 B1
(45) Date of Patent: Feb. 19, 2019

(54) METHOD FOR COMBINING NVM CLASS AND SRAM CLASS MRAM ELEMENTS ON THE SAME CHIP

(71) Applicant: Spin Transfer Technologies, Inc., Fremont, CA (US)

(72) Inventors: Mustafa Pinarbasi, Morgna Hill, CA (US); Bartlomiej Adam Kardasz, Pleasanton, CA (US); Thomas D. Boone, San Carlos, CA (US)

(73) Assignee: Spin Transfer Technologies, Inc., Fremont, CA (US)

( * ) Notice: Subject to any disclaimer, the term of this patent is extended or adjusted under 35 U.S.C. 154(b) by 0 days.

(21) Appl. No.: 15/859,451

(22) Filed: Dec. 30, 2017

(51) Int. Cl.
| | |
|---|---|
| *H01L 43/02* | (2006.01) |
| *H01L 43/12* | (2006.01) |
| *H01L 27/11* | (2006.01) |
| *H01L 27/22* | (2006.01) |
| *H01L 43/08* | (2006.01) |
| *H01F 10/32* | (2006.01) |
| *G11C 11/16* | (2006.01) |
| *G11C 11/41* | (2006.01) |

(52) U.S. Cl.
CPC .............. *H01L 43/12* (2013.01); *H01L 27/11* (2013.01); *H01L 27/222* (2013.01); *H01L 43/02* (2013.01); *H01L 43/08* (2013.01); *G11C 11/161* (2013.01); *G11C 11/41* (2013.01); *H01F 10/3286* (2013.01)

(58) Field of Classification Search
None
See application file for complete search history.

(56) References Cited

U.S. PATENT DOCUMENTS

| | | | |
|---|---|---|---|
| 8,747,680 B1* | 6/2014 | Deshpande | G11B 5/84 216/22 |
| 9,577,183 B2* | 2/2017 | Kim | H01L 43/12 |
| 2017/0256708 A1* | 9/2017 | Krounbi | H01L 43/12 |
| 2017/0279037 A1* | 9/2017 | Saida | H01L 43/08 |
| 2018/0097175 A1* | 4/2018 | Chuang | H01L 43/08 |

* cited by examiner

*Primary Examiner* — Mounir S Amer
(74) *Attorney, Agent, or Firm* — Zilka-Kotab, P.C.

(57) ABSTRACT

A method for manufacturing a magnetic random access memory chip having magnetic memory elements with different performance characteristics formed on the same chip. The magnetic memory elements can be magnetic random access memory elements. The memory chip can have a first set of magnetic random access chips having a first set of physical and performance characteristics formed in a first area of the sensor and a second set of magnetic random access chips having a second set of performance characteristics formed in a second area of the chip. For example, the first set of magnetic random access memory elements can have performance characteristics that match or exceed those of a non-volatile memory, whereas the second set of magnetic random access memory elements can have performance characteristic that match or exceed those of a static random access memory element.

18 Claims, 20 Drawing Sheets

METHOD FOR COMBINING NVM CLASS AND SRAM CLASS MRAM ELEMENTS ON THE SAME CHIP

FIELD OF THE INVENTION

The present invention relates to magnetic random access memory fabrication and more particularly to a method for fabricating both non-volatile memory class elements and static random access memory elements on the same memory chip.

BACKGROUND

Magnetic Random Access Memory (MRAM) is a non-volatile data memory technology that stores data using magnetoresistive cells such as Magnetoresistive Tunnel Junction (MTJ) cells. At their most basic level, such MTJ elements include first and second magnetic layers that are separated by a thin, non-magnetic layer such as a tunnel barrier layer, which can be constructed of a material such as Mg—O. The first magnetic layer, which can be referred to as a reference layer, has a magnetization that is fixed in a direction that is perpendicular to that plane of the layer. The second magnetic layer, which can be referred to as a magnetic free layer, has a magnetization that is free to move so that it can be oriented in either of two directions that are both generally perpendicular to the plane of the magnetic free layer. Therefore, the magnetization of the free layer can be either parallel with the magnetization of the reference layer or anti-parallel with the direction of the reference layer (i.e. opposite to the direction of the reference layer).

The electrical resistance through the MTJ element in a direction perpendicular to the planes of the layers changes with the relative orientations of the magnetizations of the magnetic reference layer and magnetic free layer. When the magnetization of the magnetic free layer is oriented in the same direction as the magnetization of the magnetic reference layer, the electrical resistance through the MTJ element is at its lowest electrical resistance state. Conversely, when the magnetization of the magnetic free layer is in a direction that is opposite to that of the magnetic reference layer, the electrical resistance across the MTJ element is at its highest electrical resistance state.

The switching of the MTJ element between high and low resistance states results from electron spin transfer. An electron has a spin orientation. Generally, electrons flowing through a conductive material have random spin orientations with no net spin orientation. However, when electrons flow through a magnetized layer, the spin orientations of the electrons become aligned so that there is a net aligned orientation of electrons flowing through the magnetic layer, and the orientation of this alignment is dependent on the orientation of the magnetization of the magnetic layer through which they travel. When, the orientations of the magnetizations of the free and reference layer are oriented in the same direction, the spin of the electrons in the free layer are in generally the same direction as the orientation of the spin of the electrons in the reference layer. Because these electron spins are in generally the same direction, the electrons can pass relatively easily through the tunnel barrier layer. However, if the orientations of the magnetizations of the free and reference layers are opposite to one another, the spin of electrons in the free layer will be generally opposite to the spin of electrons in the reference layer. In this case, electrons cannot easily pass through the barrier layer, resulting in a higher electrical resistance through the MTJ stack.

Because the MTJ element can be switched between low and high electrical resistance states, it can be used as a memory element to store a bit of data. For example, the low resistance state can be read as an on or "1", whereas the high resistance state can be read as a "0". In addition, because the magnetic orientation of the magnetic free layer remains in its switched orientation without any electrical power to the element, it provides a robust, non-volatile data memory bit.

To write a bit of data to the MTJ cell, the magnetic orientation of the magnetic free layer can be switched from a first direction to a second direction that is 180 degrees from the first direction. This can be accomplished, for example, by applying a current through the MTJ element in a direction that is perpendicular to the planes of the layers of the MTJ element. An electrical current applied in one direction will switch the magnetization of the free layer to a first orientation, whereas an electrical current applied in a second direction will switch the magnetic of the free layer to a second, opposite orientation. Once the magnetization of the free layer has been switched by the current, the state of the MTJ element can be read by reading a voltage across the MTJ element, thereby determining whether the MTJ element is in a "1" or "0" bit state. Advantageously, once the switching electrical current has been removed, the magnetic state of the free layer will remain in the switched orientation until such time as another electrical current is applied to again switch the MTJ element. Therefore, the recorded date bit is non-volatile in that it remains intact in the absence of any electrical power.

SUMMARY

The present invention provides a method for manufacturing a magnetic data chip having magnetic random access memory elements with different performance characteristics. The magnetic memory chip includes a substrate with a first plurality of magnetic random access memory chips formed on a first area of the substrate. A second plurality of magnetic random access memory chips are formed on a second area of the substrate. The second plurality of magnetic random access memory chips have performance characteristics that are different from those of the first plurality of magnetic random access memory chips.

For example, the first plurality of magnetic random access memory elements can have performance characteristics that meet or exceed those of non-volatile memory structure. The second plurality of magnetic random access memory elements can have performance characteristics that meet or exceed those of a static random access memory structure.

In this way, the magnetic random access memory can advantageously be used as a replacement of other types of memory such as solid state non-volatile memory and also static random access memory, each of which have different and unique performance requirements and characteristics.

Magnetic random access memory elements having different performance characteristics can be formed on the same memory chip by a novel process that involves depositing two different types of magnetic memory material in different areas on a substrate and patterning and etching those to different materials in a common process. A first magnetic memory material can be deposited in a first area, and a second magnetic memory material can be deposited in a second area on the substrate.

This can be performed, for example, by depositing a first magnetic random access memory material full film over the substrate. A first mask can then be formed that covers a first magnetic element area, and a material removal process can then be performed to remove portions of the first magnetic random access material that are not protected by the first mask. A second magnetic random access memory material can then be deposited and the mask removed, leaving areas of second magnetic random access material adjacent to areas of first magnetic random access material.

A second mask can then be formed that defines magnetic element pillars in both first sensor element areas and in a second sensor element area. A material removal process can be performed to remove portions of both the first and second magnetic random access material that are not protected by the second mask structure, thereby leaving defined magnetic element pillars in both the first element area and the second element area.

Because the material making up the first magnetic random access memory material will be very similar to the material making up the second magnetic random access material, the formation of pillars in each of the first and second area can advantageously be performed in a common mask patterning and material removal step. The material removal rates and characteristics will be essentially the same in both areas.

These and other features and advantages of the invention will be apparent upon reading of the following detailed description of the embodiments taken in conjunction with the figures in which like reference numeral indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION

The following description is of the best embodiments presently contemplated for carrying out this invention. This description is made for the purpose of illustrating the general principles of this invention and is not meant to limit the inventive concepts claimed herein.

Figure 1:
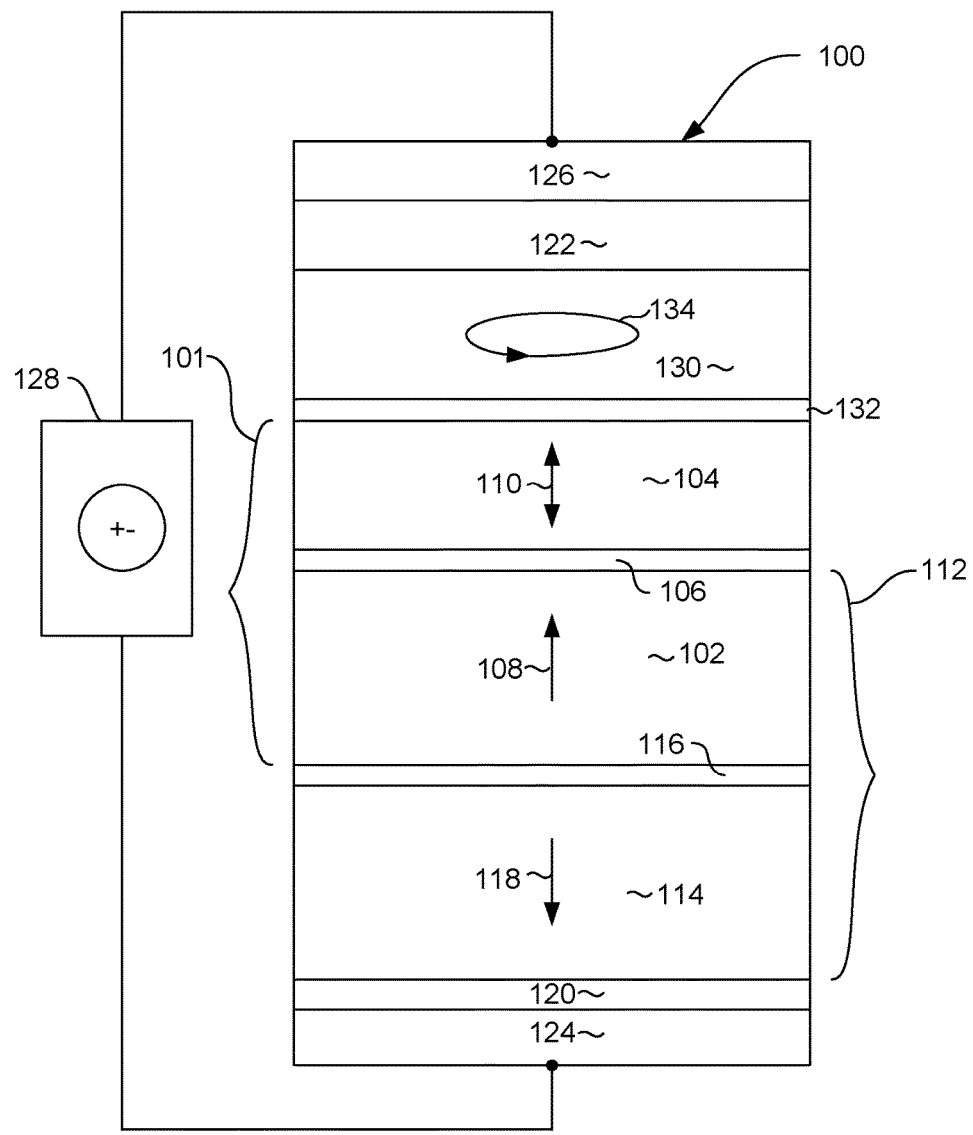
FIG. 1 is a schematic, cross sectional view of a perpendicular magnetic tunnel junction (pTMR) element, such as might be used in an embodiment of the invention.

Referring now to FIG. 1, a magnetic memory element 100 can be in the form a of a perpendicular magnetic tunnel junction (pMTJ) memory element. The magnetic memory element can include an MTJ junction 101 that can include a magnetic reference layer 102, a magnetic free layer 104 and a thin, non-magnetic, electrically insulating magnetic barrier layer 106 located between the magnetic reference layer 102, and magnetic free layer 104. The magnetic reference layer has a magnetization 108 that is fixed in a direction that is preferably perpendicular to the plane of the layers as indicated by arrow 108. The magnetic free layer has a magnetization 110 that can be in either of two directions perpendicular to the plane of the layer 104. While the magnetization 110 of the free layer remains in either of two directions perpendicular to the plane of the layer 104 in a quiescent state, it can be moved between these two directions as will be described in greater detail herein below. When the magnetization 110 of the magnetic free layer 104 is in the same direction as the magnetization 108 of the reference layer 102, the electrical resistance across the layers 102, 106, 104 is at a low resistance state. Conversely, when the magnetization 110 of the free layer 104 is opposite to the magnetization 108 of the reference layer 102, the electrical resistance across the layers 102, 106, 104 is in a high resistance state.

The magnetic reference layer 102 can be part of an anti-parallel magnetic pinning structure 112 that can include a magnetic keeper layer 114, and a non-magnetic, antiparallel coupling layer 116 located between the keeper layer 114 and reference layer 102. The antiparallel coupling layer 116 can be a material such as Ru and can be constructed to have a thickness such that it will ferromagnetically antiparallel couple the layers 114, 102. The antiparallel coupling between the layers 114, 102 pins the magnetization 108 of the reference layer 102 in a direction opposite to the direction of magnetization 118 of the keeper layer 114.

A seed layer 120 may be provided near the bottom of the memory element 100 to initiate a desired crystalline structure in the above deposited layers. A capping layer 122 may be provided near the top of the memory element 100 to protect the underlying layers during manufacture, such as during high temperature annealing. Also, electrodes 124, 126 may be provided at the top and bottom of the memory element 100. The electrodes 124, 126 may be constructed of a non-magnetic, electrically conductive material such as Cu and can provide electrical connection with circuitry 128 that can include a current source and can further include circuitry for reading an electrical resistance across the memory element 100.

The magnetic free layer 104 has a magnetic anisotropy that causes the magnetization 110 of the free layer 104 to remain stable in one of two directions perpendicular to the plane of the free layer 104. In a write mode, the orientation of the magnetization 110 of the free layer 104 can be switched between these two directions by applying an electrical current through the memory element 100 from the circuitry 128. A current in one direction will cause the memory element to flip to a first orientation, and a current in an opposite direction will cause the magnetization to flip to a second, opposite direction. For example, if the magnetization 110 is initially oriented in a downward direction in FIG. 1, applying a current in a downward direction through the element 100 will cause electrons to flow in an opposite direction upward through the element 100. The electrons travelling through the reference layer will become spin polarized as a result of the magnetization 108 of the reference layer 102. These spin polarized electrons cause a spin torque on the magnetization 110 of the free layer 104, which causes the magnetization to flip directions.

On the other hand, if the magnetization 110 of the free layer 104 is initially in an upward direction in FIG. 1, applying an electrical current through the element 100 in an upward direction will cause electrons to flow in an opposite direction, downward through the element 100. However, because the magnetization 110 of the free layer 104 is opposite to the magnetization 108 of the reference layer 102, the electrons with an opposite spin will not be able to pass through the barrier layer 106 to the reference layer 102. As a result, the electrons having an opposite spin will accumulate at the junction between the free layer 104 and barrier layer 106. This accumulation of spin polarized electrons causes a spin torque that causes the magnetization 110 of the free layer 104 to flip from a downward direction to an upward direction.

In order to assist the switching of the magnetization 110 of the free layer 104, the memory element 100 may include a spin polarization layer 130 formed above the free layer 104. The spin polarization layer can be separated from the free layer 104 by an exchange coupling layer 132. The spin polarization layer 130 has a magnetic anisotropy that causes it to have a magnetization 134 with a primary component oriented in the in plane direction (e.g. perpendicular to the magnetizations 110, 108 of the free and reference layers 104, 102. The magnetization 134, of the spin polarization layer 130 may either be fixed or can move in a precessional manner as shown in FIG. 100. The magnetization 134 of the spin polarization layer 130 causes a spin torque on the free layer 104 that assists in moving its magnetization away from its quiescent state perpendicular to the plane of the free layer 104. This allows the magnetization 110 of the free layer 104 to more easily flip using less energy when applying a write current to the memory element 100.

Figure 2:
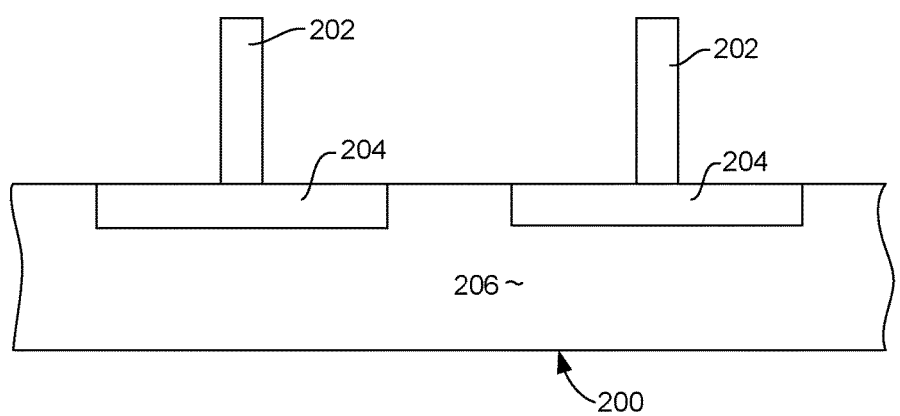
FIG. 2 is a side, cross sectional view of memory elements formed on a substrate.

FIG. 2 shows a side, cross sectional view of a portion of a memory chip. One or more MRAM memory elements 202 can be formed on top of circuitry such as CMOS semiconductor circuitry element 204. The MRAM memory element 202 can be formed as a pillar structure on the semiconductor circuitry element 204, and multiple MRAM element/circuitry element combinations 202/204 can be included on a single memory chip 200 on a semiconductor substrate 206.

Magnetic Random Access Memory (MRAM) provides unique performance and endurance attributes not available with other types of data memory. As such, MRAM has the potential to replace or augment other types of data memory. For example, MRAM data storage can be used to replace different types of previously existing memory structures, such as Non-Volatile Memory (NVM) flash and/or Static Random Access Memory (SRAM). However, such different types of memory have different performance metrics. For example, as the name suggests NVM memory cells may require high retention, such as requiring that the data remain recorded for a long duration (i.e. 10 years at 125 degrees C.). However, this high retention may come with the tradeoff of having lower recording speed and lower endurance as measured in the number of times the memory cell can be switched in its lifetime. On the other hand SRAM memory has a need for much greater speed and the ability to be recorded and switched many times (i.e. high endurance), but can have lower retention, such as only retaining data for minutes to days without the application of electrical power.

In order to effectively replace previously existing data types such as NVM and SRAM application it is desirable that the utilized MRAM storage cells be configured to meet or exceed these different performance metrics. The structure of an MRAM cell can be modified and configured to meet either performance requirement, and in many applications it may be desirable to have MRAM cells that provide these different performance characteristics on a single memory chip.

Figure 3:
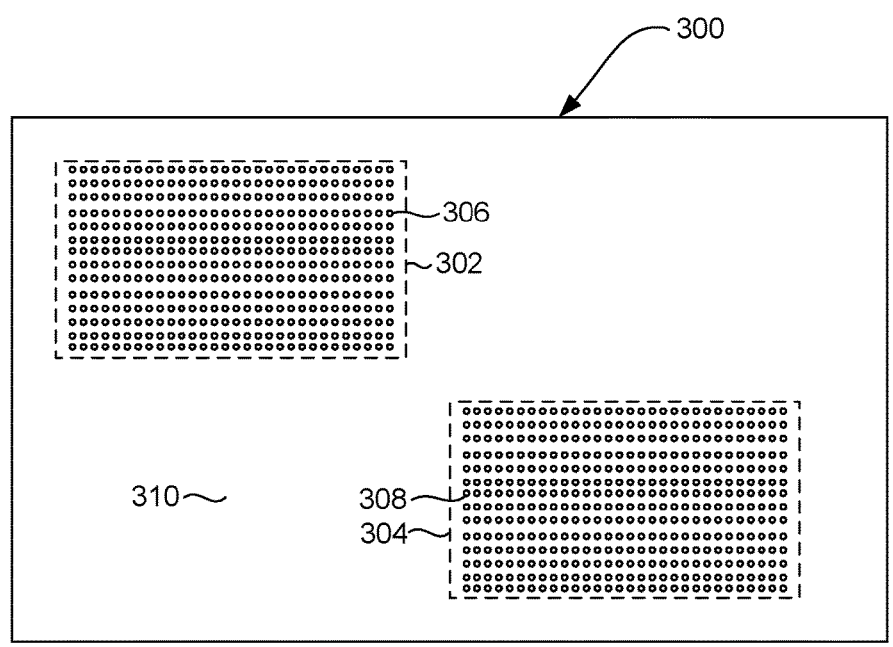
FIG. 3 is a top down view of a chip including a two regions with different classes of magnetic memory elements.

FIG. 3 shows a top down view of an exemplary magnetic memory chip 300. The memory chip 300 includes first and second memory arrays 302, 304 each having different memory element characteristics. For example, the first area 302 can include a plurality of first MRAM memory elements 306 having performance characteristics emulating non-volatile memory (NVM). Area 304 can include a second plurality of MRAM memory elements 308 that have performance characteristics that emulate those of Static Random Access Memory (SRAM). Each of the memory elements 306, 308 can be formed on and electrically connected with underlying circuitry such as CMOS circuitry (not shown in FIG. 3). The memory elements 306, 308 can be formed on a chip substrate 310.

The incorporation of MRAM memory elements having different physical and performance characteristics on a single memory chip presents manufacturing challenges, since different memory elements must be formed on a common substrate at a same build level on the substrate. These challenges are addressed with reference to FIGS. 4-13 which illustrate a method for manufacturing a memory chip having memory elements with different physical and performance characteristics.

Figure 4:
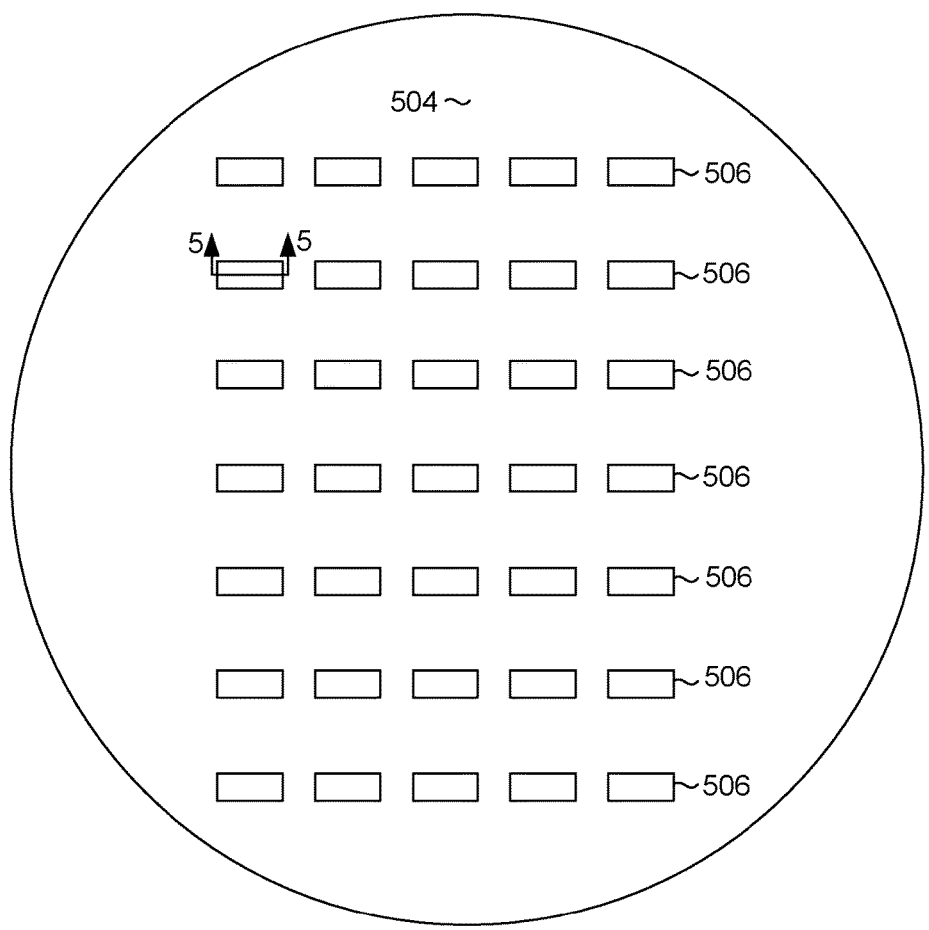
FIGS. 4-13 are views of a wafer in various intermediate stages of manufacture, illustrating a method for manufacturing a chip having different classes of magnetic memory elements.
Figure 5:
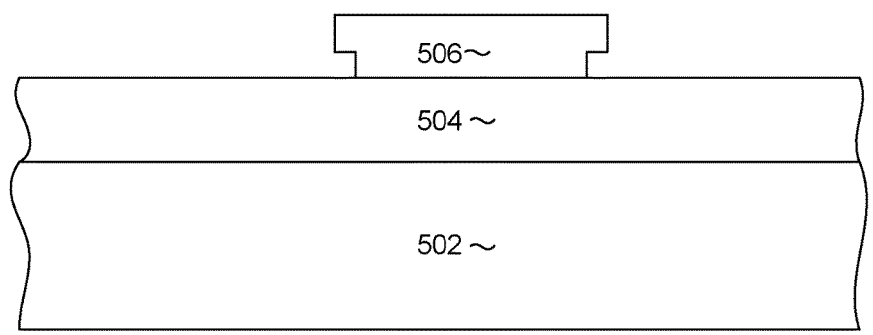

FIG. 4 shows a top down view of a wafer in an intermediate stage of manufacture, and FIG. 5 is an enlarged, cross-sectional view seen from line 5-5 of FIG. 4. As seen more clearly in FIG. 5, a layer of material 504 constituting a first MRAM element type is deposited over a substrate 502 such as a semiconductor substrate which may include circuitry such as CMOS circuitry (not shown in FIG. 5). While the layer 504 is shown in FIG. 5 as a single layer, this is for purposes of simplicity and clarity and it should be understood that the layer 504 can include multiple layers such as those that would make up an MRAM element such as that described above with reference to FIG. 1.

After the first memory element layer 504 is deposited, a mask structure 506 is formed over the layer 504. The mask structure is preferably a bi-layer, lift off mask having overhanging edges as shown, which will facilitate later liftoff of the mask as will be clearer herein below. The mask 506 can be constructed of one or more layers of photoresist which can be photolithographically patterned and developed to have the desired shape. In FIG. 4, which shows a top down view, it can be seen that the mask structure 506 is formed to cover areas that will define a first MRAM type array. This could be an area of sensors meeting NVM or SRAM performance metrics.

Figure 6:
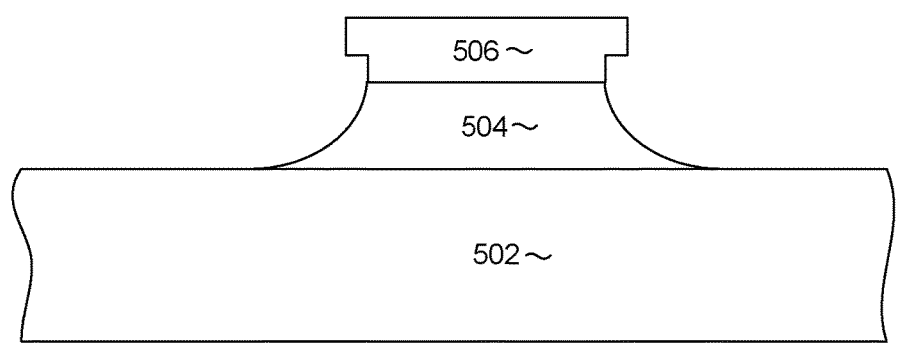

Then, a material removal process such as ion beam etching or reactive ion etching is performed to remove portions of the first MRAM element material 504 that are not protected by the mask 506, leaving a structure such as that shown in FIG. 6. The outer edge of the remaining material 504 may have an imperfect junction shape as shown. However that portion will be later removed as will be seen.

Figure 7:
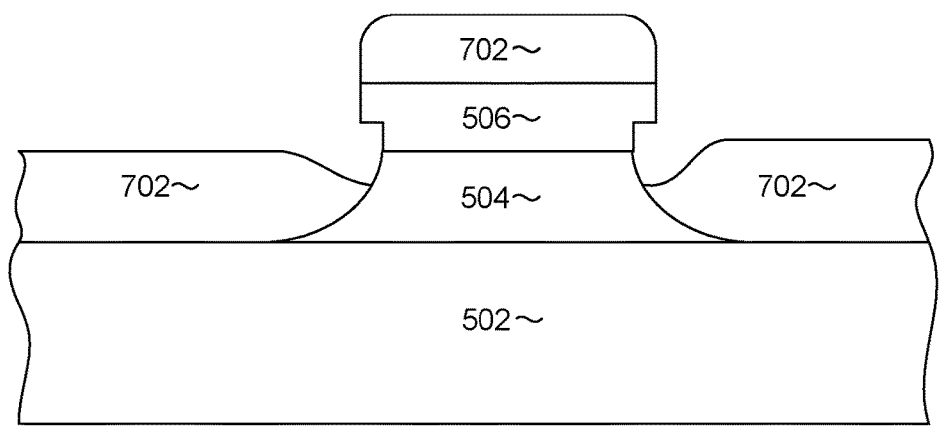

With reference to FIG. 7, a layer of second MRAM element material 702 is deposited full film. Again, while the layer 702 is shown as a single layer, it can actually include various layers necessary to form a MRAM sensor such as that described above with reference to FIG. 1. After depositing the second MRAM layer 702, the mask 506 can be lifted off, leaving a structure such as that shown in FIG. 8. Because the mask 506 is constructed as a bi-layer mask, the deposition of the second MRAM layer 702 will leave an opening to expose the mask at the outer edges of the mask 506, as shown in FIG. 7. This facilitates the removal of the mask 506, which can be performed, for example, by a chemical liftoff process.

Figure 8:
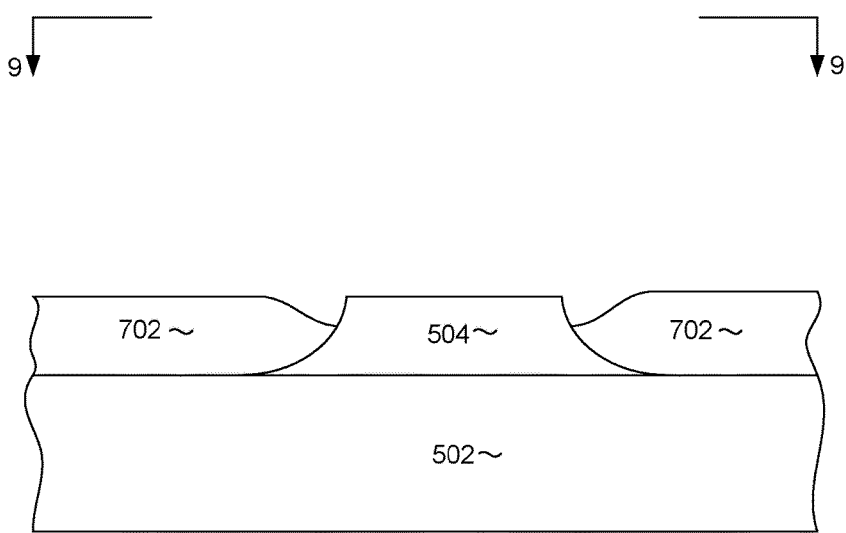
Figure 9:
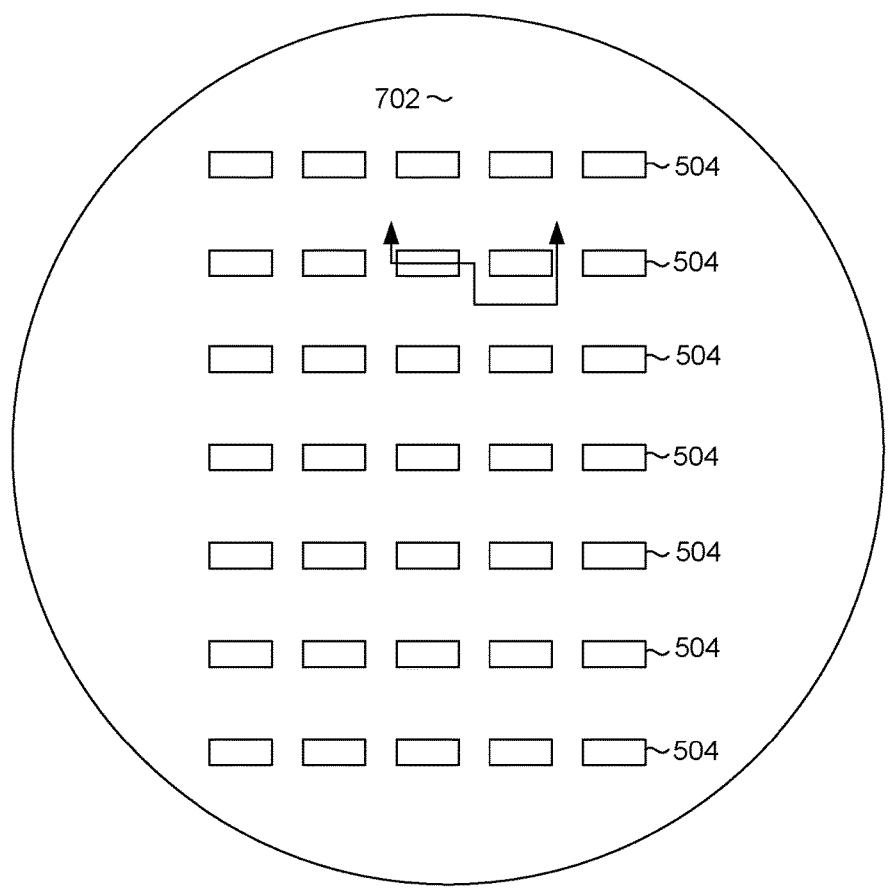

FIG. 9 shows a top down view as seen from line 9-9 of FIG. 8, but expanded to shown an entire wafer. In FIG. 9, it can be seen that the previously performed deposition and mask liftoff processes leave defined areas of first MRAM material 504 surrounded by areas of second MRAM material 702. The second MRAM material essentially covers all areas that are not covered with first MRAM material 504, such that the second MRAM material 702 surrounds the areas of first MRAM material 504. At this point, one or more annealing processes can be performed as needed to set the magnetization of keeper and reference layers 102, 114 described previously above with reference to FIG. 1. The annealing process can include heating the wafer to a temperature at or above the optimum crystallization temperature of the materials of layers 102, 114, such as 300 to 400 degrees C. for 10 minutes to 60 minutes.

So, at this point the wafer includes defined areas of first MRAM material 504 and a second MRAM material 702 everywhere else on the wafer. In both areas, the first and second MRAM layers 504, 702 have very similar thicknesses and materials. Therefore, standard processes for defining MRAM pillars can be performed in both areas simultaneously with good results for both types of MRAM material.

Figure 10:
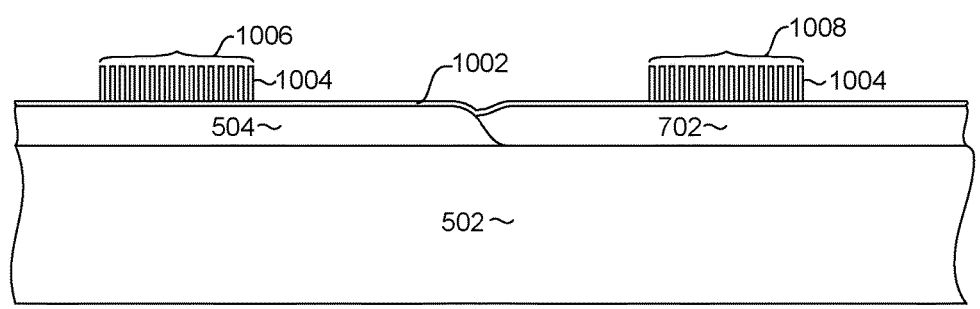

FIG. 10 shows a cross sectional view taken from line 10-10 of FIG. 9. From FIG. 9 it can be seen that the cross section shown in FIG. 10 is not a straight cross section but is staggered so as to show both first and second MRAM device areas. With reference to FIG. 10, a hard mask material layer such as diamond like carbon DLC 1002 is deposited over the first and second MRAM materials 502, 702. A photoresist mask 1004 is formed over the hard mask 1002. The photoresist mask 1004 can be formed by spinning on a glass type photoresist layer such as a photoresist that includes Si. This photoresist material 1004 is then photolithographically patterned and developed to define a mask shape having individual pillars that will define MRAM pillars as will be seen. It can also be seen that the photoresist mask defines such pillars in an area 1006 that will be a first MRAM type area and also in an area 1008 that will be a second MRAM type area. The patterning of the photoresist can be done in any desired shape and can define different pillar shapes and sizes in each of the MRAM areas 1006, 1008.

Figure 11:
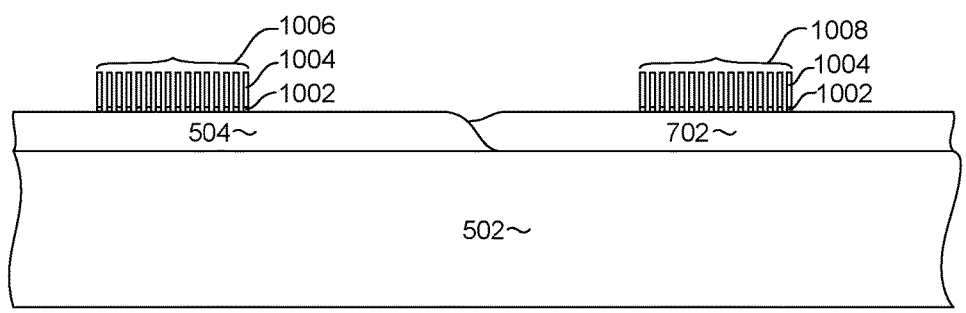

With reference now to FIG. 11, the pattern of the photoresist mask 1004 can be transferred to the underlying hard mask 1002. This can be performed for example, by performing a Reactive Ion Etching (RIE) in a chemistry that will preferentially remove the hard mask material layer 1002.

Figure 12:
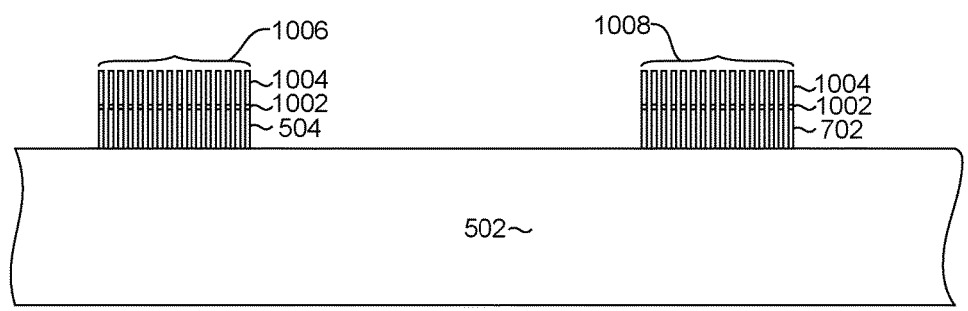

Once the photoresist mask pattern 1004 has been transferred to the hard mask layer 1002, a material removal process can be performed to remove portions of the first and second MRAM materials 504, 702 that are not protected by the hard mask 1002, leaving a structure such as shown in FIG. 12. This process can be performed using ion beam etching. While some or all of the photoresist mask 1004 may be removed by this process, the hard mask 1002 will remain intact to accurately define the pillars of MRAM material 504, 702. Again, because both first and second MRAM layers 504, 702 are constructed of similar materials having similar thicknesses, the material removal process (e.g. ion beam etching) can be performed simultaneously on both materials 504, 702 with essentially identical results and material removal rates.

Figure 13:
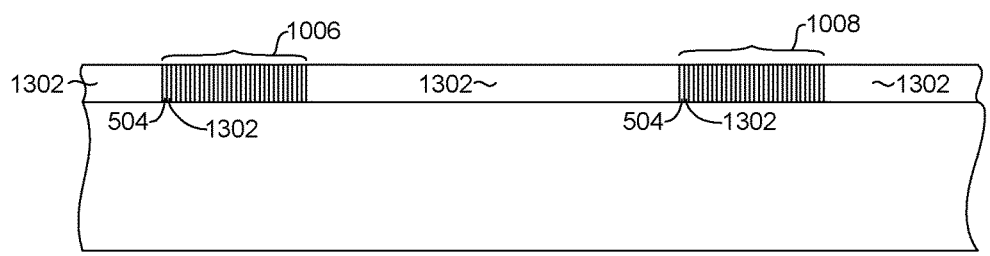

After the pillars of material 504, 702 have been defined, an insulating fill layer such as alumina 1302 can be deposited by a conformal deposition process such as atomic layer deposition (ALD), and a planarization process such as chemical mechanical polishing (CMP) can be performed, leaving a structure such as that shown in FIG. 13. The conformal deposition of insulating fill material 1302 can be performed so as to fill area between individual pillars 504, 702 in each of the areas 1006, 1008 as well as filling the spaces between the areas 1006, 1008. The planarization process (i.e. chemical mechanical polishing) can be performed sufficiently to expose the tops of the pillars 504, 702 so that electrical contact can be made with the tops of the individual pillars 504, 702.

Figure 14:
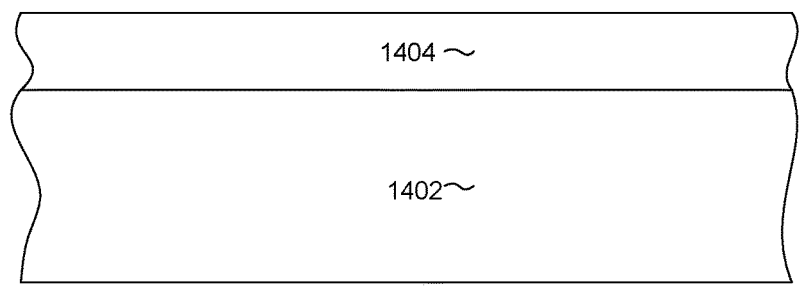
FIGS. 14-20 are views of a wafer in various intermediate stages of manufacture, illustrating an alternate method for manufacturing a chip having different classes of magnetic memory elements.

FIGS. 14-20 illustrate an alternate method for forming areas of MRAM elements with different performance characteristics. This alternate method utilizes a mask liftoff process. With reference to FIG. 14, a substrate 1402 is formed on a wafer. As previously described this substrate can include circuitry such as CMOS elements (not shown). A layer of photoresist mask material 1404 is deposited over the substrate 1402. The mask layer can be a bi-layer lift-off structure (not shown) and could also include other material layers as well.

Figure 15:
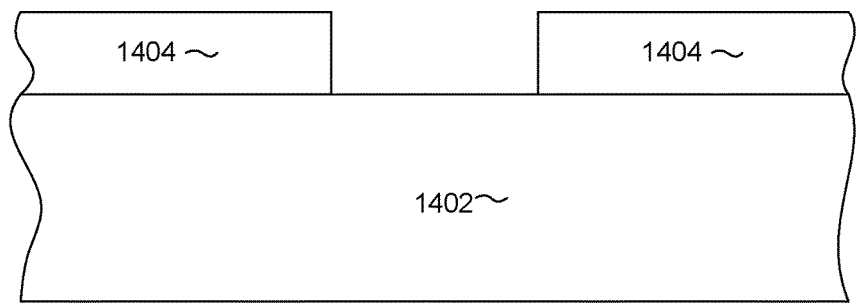
Figure 16:
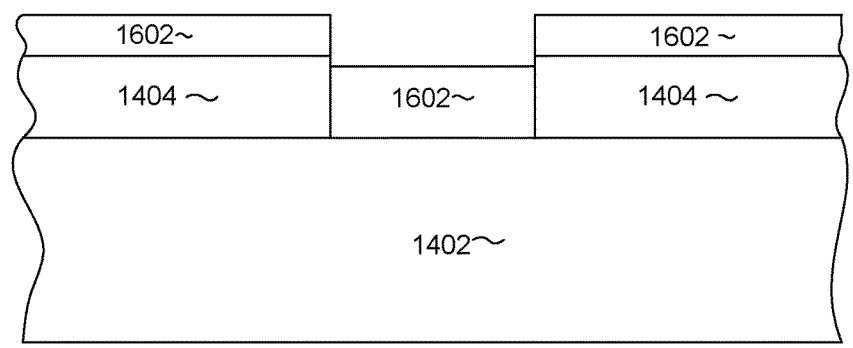

With reference to FIG. 15, the photoresist mask material is photolithographically patterned and developed so as to remove mask material leaving an opening in a region that will define a first MRAM area. Then, with reference to FIG. 16, a layer of first MRAM material is deposited full film over the wafer. As previously described, although shown as a single layer, the first MRAM material 1602 includes various material layers used to construct one or more MRAM elements having a first set of performance characteristics. The material 1602 will be deposited into the opening in the mask 1404 as well as over the top of the mask 1404.

Figure 17:
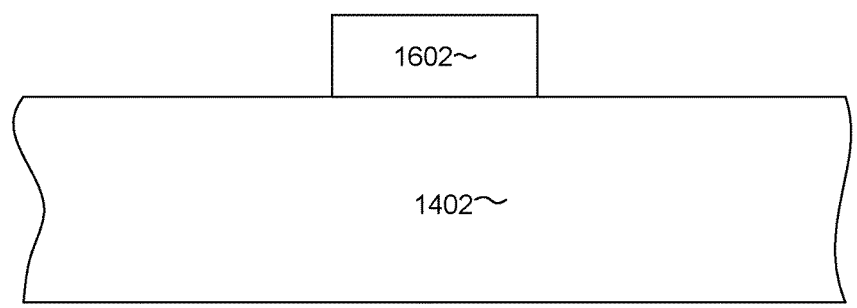
Figure 18:
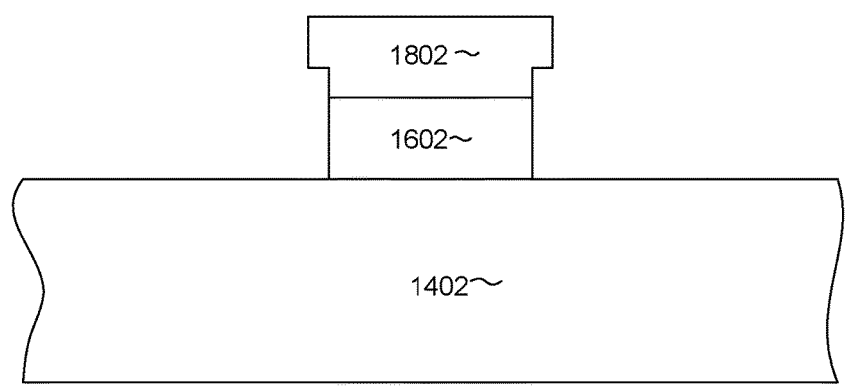

The mask 1404 can then be lifted off, removing the material formed over the mask 1404, and leaving a structure as shown in FIG. 17 with first MRAM material 1602 only in the area defined by the opening in the first mask 1404. Then, with reference to FIG. 18, a second liftoff mask 1802 is formed over the area of the remaining material 1602. Perfect alignment of this mask 1802 is not critical, since areas at the outer edges defined by the mask 1802 will be removed during pillar definition. The second mask 1802 can be a bi-layer photoresist mask to facilitate liftoff after further material layer deposition.

Figure 19:
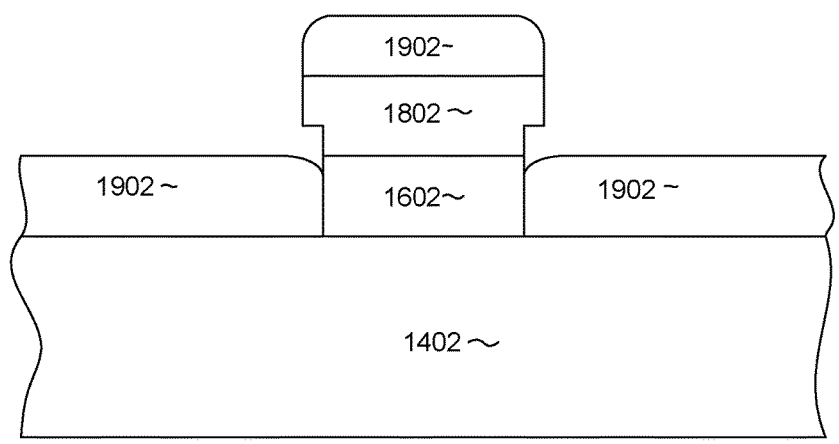
Figure 20:
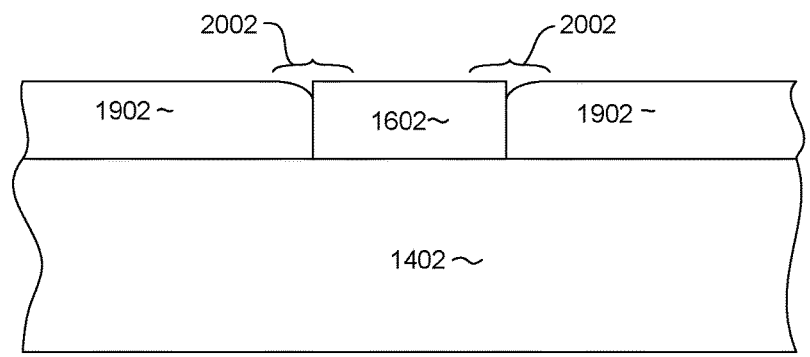

After forming the mask 1802, as shown in FIG. 19, a layer of second MRAM material 1902 is deposited full film. Again, this layer 1902 can include various layers of material needed to form a desired MRAM element having a second set of performance characteristics. After deposition of the material 1902, the mask 1802 can be lifted off by a process such as chemical liftoff, leaving a structure as shown in FIG. 20. In FIG. 20, the areas at the junction of the two layers 1602, 1902 (shown by brackets 2002) need not be critically located or perfectly smooth as these areas will be removed during further processing to define MRAM pillar formation.

After forming the two MRAM material layers 1602, 1902 as shown in FIG. 20, further processing can be performed to define the desired MRAM pillars. These pillar definition processes can be similar to those described above with reference to FIGS. 9-13.

The above described processes provide an efficient and cost effective means for forming sensors having different performance characteristics on different areas of a memory chip. While these processes have been described as a method for forming Non-Volatile Memory (NVM) and Static Random Access Memory (SRAM) replacement using MRAM elements, this is by way of an exemplary embodiment. Other types of magnetic memory elements having different characteristics could also be manufactured in such a manner. Also, while the above process has been described as a method for manufacturing only two different types of MRAM elements, a greater number of different types of MRAM elements could also be constructed by the above described process.

While various embodiments have been described above, it should be understood that they have been presented by way of example only and not limitation. Other embodiments falling within the scope of the invention may also become apparent to those skilled in the art. Thus, the breadth and scope of the inventions should not be limited by any of the above-described exemplary embodiments, but should be defined only in accordance with the following claims and their equivalents.

What is claimed is:

1. A method for forming a data memory chip, comprising: providing a substrate: depositing a first magnetic memory element type material; forming a mask over the first magnetic memory element type material the mask defining a first magnetic element type area; performing a material removal process to remove portions of the first magnetic element type material that are not protected by the mask; depositing a second magnetic element type material; and removing the mask, after removing the mask: depositing a hard mask; performing an annealing; forming a magnetic element defining mask configured to define magnetic elements in the first magnetic element type area and also in a second magnetic element type area; and performing a second material removal process to remove portions of the first magnetic element type material and the second magnetic element type material that are not protected by the magnetic element defining mask.

2. The method as in claim 1, wherein the second material removal process comprises reactive ion etching (RIE).

3. The method as in claim 1, wherein the mask is a bi-layer mask that includes photoresist.

4. The method as in claim 1, wherein the substrate includes electrical circuitry.

5. The method as in claim 1, wherein the substrate includes CMOS circuitry.

6. The method as in claim 1, wherein the substrate includes CMOS circuitry that is electrically connected with each of the first and second magnetic memory element type material.

7. A method for manufacturing a data memory chip, the method comprising: providing a substrate; forming a first mask structure over the substrate, the mask structure having an opening configured to define a first magnetic memory type area; depositing a first magnetic memory type material; removing the mask, leaving first magnetic memory type material in a first memory type area; forming a second mask, at least a portion of the second mask being formed over the first magnetic memory type material in the first memory type area; depositing a second magnetic memory type material; and removing the second mask, after removing the second mask: depositing a hard mask; performing an annealing; forming a third mask structure configured to define magnetic pillars in the first magnetic memory type are and in a second magnetic memory type are; and performing a material removal process to remove both of the first and second magnetic memory type material that are not protected by the third mask.

8. The method as in claim 7, wherein the substrate includes electrical circuitry formed therein.

9. The method as in claim 7, wherein the substrate includes CMOS circuitry formed therein.

10. The method as in claim 7, wherein the substrate includes CMOS circuitry formed therein, the CMOS circuitry having electrical connection with each of the first and second magnetic memory type materials.

11. The method as in claim 1, wherein the first magnetic memory element type material has performance characteristics matching or exceeding those of a non-volatile memory, and the second magnetic memory element type material has performance characteristics matching or exceeding those of a static random access memory.

12. The method as in claim 7, wherein the first magnetic memory type material has performance characteristics matching or exceeding those of a non-volatile memory, and the second magnetic memory type material has performance characteristics matching or exceeding those of a static random access memory.

13. The method as in claim 1, wherein the first magnetic memory element type material has a thickness that is substantially the same as a thickness of the second magnetic memory element type material.

14. The method as in claim 7, wherein the first magnetic memory type material has a thickness that is substantially the same as a thickness of the second magnetic memory type material.

15. The method as in claim 1, wherein the first magnetic memory element type material has an ion milling rate that is substantially the same as an ion milling rate of the second magnetic memory element type material.

16. The method as in claim 7, wherein the first magnetic memory type material has an ion milling rate that is substantially the same as an ion milling rate of the second magnetic memory type material.

17. The method as in claim 1, wherein the first magnetic memory element type material has a thickness and ion milling rate that are substantially the same as a thickness and ion milling rate of the second magnetic memory element type material.

18. The method as in claim 7, wherein the first magnetic memory type material has a thickness and ion milling rate that are substantially the same as a thickness and ion milling rate of the second magnetic memory type material.

* * * * *